United States Patent [19]
Christy

[11] Patent Number: 5,895,559
[45] Date of Patent: *Apr. 20, 1999

[54] CATHODIC ARC CATHODE

[76] Inventor: Ronald Christy, 26615 Ocean View Dr., Malibu, Calif. 90265

[*] Notice: This patent issued on a continued prosecution application filed under 37 CFR 1.53(d), and is subject to the twenty year patent term provisions of 35 U.S.C. 154(a)(2).

[21] Appl. No.: 08/833,676
[22] Filed: Apr. 8, 1997

Related U.S. Application Data

[60] Provisional application No. 60/015,033, Apr. 8, 1996.
[51] Int. Cl.$^6$ .................................................. C23C 14/32
[52] U.S. Cl. ................................... 204/192.38; 204/298.41
[58] Field of Search ............................ 204/192.38, 298.41

[56] References Cited

U.S. PATENT DOCUMENTS

| | | | |
|---|---|---|---|
| 3,783,231 | 1/1974 | Sablev et al. | 219/123 |
| 3,793,179 | 2/1974 | Sablev et al. | 204/298 |
| 3,836,451 | 9/1974 | Smapper | 204/298 |
| 4,559,121 | 12/1985 | Mularie | 204/192 R |
| 4,673,477 | 6/1987 | Ramalingam et al. | 204/298.41 X |
| 4,895,765 | 1/1990 | Sue et al. | 204/192.38 X |
| 4,929,322 | 5/1990 | Sue | 204/192.38 |
| 5,026,466 | 6/1991 | Wesemeyer et al. | 204/298.41 X |
| 5,363,400 | 11/1994 | Damond et al. | 204/298.41 X |
| 5,387,326 | 2/1995 | Buhl et al. | 204/298.41 X |

Primary Examiner—Nam Nguyen
Assistant Examiner—Rodney G. McDonald
Attorney, Agent, or Firm—Sheldon H. Parker

[57] ABSTRACT

A cathodic arc cathode is provided with an insulating ring in close proximity to the underside of the cantilevered edge of the target, and with no other conducting surface exposed in the coating system. An electrical connection is provided to opposite ends of the cathode through two or more low resistance resistors with high temperature coefficients of resistance. For all cases of cathodic arc deposition, the system causes the arc to reliably remain on the cathode surface and move randomly, thereby assuring uniform cathode erosion on large or small planar or cylindrical cathodes, which can be produced at low cost.

21 Claims, 3 Drawing Sheets

CATHODIC ARC CATHODE

This is a continuation-in-part of copending application(s) Ser. No. 60/015,033 filed on Apr. 8, 1996.

BACKGROUND OF THE INVENTION

1. Field of the Invention

This invention relates in general to coatings applied by physical vapor deposition, and in particular to a new and useful large or small cathodic arc source design for reliable operation and uniform cathode erosion.

2. Brief Description of the Prior Art

Many prior configurations of cathodic arc sources have been designed. In all of these, it has been desirable to confine the arc to the target surface, and obtain uniform erosion. Some of the prior designs, such as U.S. Pat. No. 3,793,179 to Sablev, employ magnetic fields to confine and steer the arc along the usable target material, but result in non-uniform target erosion. These designs, however, do not work with magnetic target materials. Some system, such as U.S. Pat. No. 4,559,121 to Mukri, utilize either insulating or conducting rings around the edges of the target to confine the arc. These systems break down, or allow the arc to jump to conducting surfaces behind the target. Additionally, these systems require maintenance, as well as result in larger cathodes that require more room in the coating system. With either metal or ceramic rings around the edges of the target, only part of the total assembly area produces the vaporized coating material. U.S. Pat. Nos. 4,929,322 to Sue et al and 3,783,231 to Sablev only allow very small cathodes, thereby limiting their usefulness and requiring many units for a large production coating system. In U.S. Pat. No. 3,836,451 to Snaper, a beam gun is disclosed to direct a beam of particles onto the substrate.

With the present invention, all of the assembly area is active and is available to produce the coating material. By placing the insulator ring below, and spaced from the target, the arc is prevented from leaving the cathode, by eliminating any possible path. The inside surfaces of the insulator are well baffled to prevent coating and prevent arc conduction behind the insulators. The arc cannot enter the small gap between the insulator and the bottom cantilevered edge of the target.

SUMMARY OF THE INVENTION

The present invention provides an arrangement for stabilization of an arc with the use of an insulating ring in close proximity to the bottom cantilevered side of the target. This provides reliable operation of the arc for a wide range of the cathode sizes and shapes, and at low to very high power levels. It also eliminates any ring around the top side of the target, allowing the entire area of the cathode to provide the coating. Because of the gap between the insulating ring and the target, high cost Boron Nitride insulators are not required and low cost porcelain insulators can be used. Additionally, the cathode can be operated at high power levels. Because of the simplicity of the design virtually any size round or rectangular or cylindrical cathode may be made, allowing designs for direct retrofitting of any existing cathode.

The cathodic arc cathode within a chamber is provided with a target and a cathode body, including an insulator. The chamber can be of a circular or non-circular design. The insulator is placed between the target and the cathode body and serves to insulate the cathode body from the walls of the chamber. The insulator is manufactured from a low cost material such as porcelain or glass. A gap separates the target and the insulator and prevents an arc from jumping from the target to the insulator ring and damaging the cathode body. An electrically insulated back is proximate to, and extends beyond, the underside of the cathode body, providing support for the insulator as well as insulation between the cathode body and the chamber wall. At least two resistors, spaced from the cathode body, are alternatingly heated by the arc current causing the arc to move from the heated resistor to the unheated resistor as the arc seeks the path of least resistance. The placement of the resistors is such as to draw the arc over the surface of the target to utilize the entire surface of the target. Preferably, the resistors have a low value of resistance and a high temperature coefficient of resistance and have the ability to conduct target currents of about 300 amps. A cooling canal is provided with a first feed and a second feed, with coolant entering through the first feed and exiting through the second feed. The cooling canal can be proximate the center of the cathode body or proximate the target. If necessary for addition support a conductive backing plate can be adjacent the target.

BRIEF DESCRIPTION OF THE DRAWINGS

The advantages of the instant disclosure will become more apparent when read with the specification and the drawings, wherein.

DESCRIPTION OF THE PREFERRED EMBODIMENTS

The present invention departs from the prior art in that no magnetic steering of the arc is used, and there is no ring on the top surface of the cathode.

The instant device provides numerous advantages over the prior art devices. Unlike the prior art systems, the instant invention imposes no limits on cathode size or shape. Small to large, round, rectangular or cylindrical cathodes can all be used with equal success. Further, most of the prior designs are more complex and more expensive to produce than the present invention. The simplicity of the present invention makes lower cost production possible through use of low cost materials and a minimum of fabrication. Most of the prior art designs utilize a metal or ceramic ring around the outer edge of the target to confine the arc, allowing the arc to travel right up to the ring. This limits the power allowed to the cathode because as the power increases, a level is soon reached where the edge of the ring touching the target is damaged. By way of contrast, with the present invention, a gap between the cantilevered underside of the target and the insulator ring keeps the arc from close proximity to the insulator, allowing for higher power to be applied to the cathode without damage. The cantilevered, or similar, design is critical to provide the design which allows for the separation between the cathode and the insulator ring. The ability to use higher power provides higher coating rates for faster production. Coating rates up to twice what prior art allows are possible with the present invention.

The instant invention is designed to provide a gap, of approximately 0.015 to 0.150 inches, between the insulting ring and the cantilevered lower side of the target to keep the arc on the target. It is this gap, in combination with the geometry of the design, which prevents the arc from leaving the target surface. All other conducting surfaces inside the coating chamber and connected to the cathode are completely and tightly covered with electrically insulating material, so there is no other place for the arc to go except for the target. In addition to keeping the arc on the target, the gap serves to help cool both the insulator and the under side of the target. The gap between the target and the insulator ring very effectively keeps the arc on the target. The geometry of the gap prevents the insulator from being coated with conducting material, so no maintenance is required. This design assures continuous operation of the arc which is necessary for optimum production.

The gap prevents the arc from leaving the target surface, due to a decrease in plasma density. A minimum density of gas plasma must be maintained in the vacuum in order to sustain the arc. The area around the gap has a decreased density sufficient to prevent the arc from being sustained.

Figure 1:
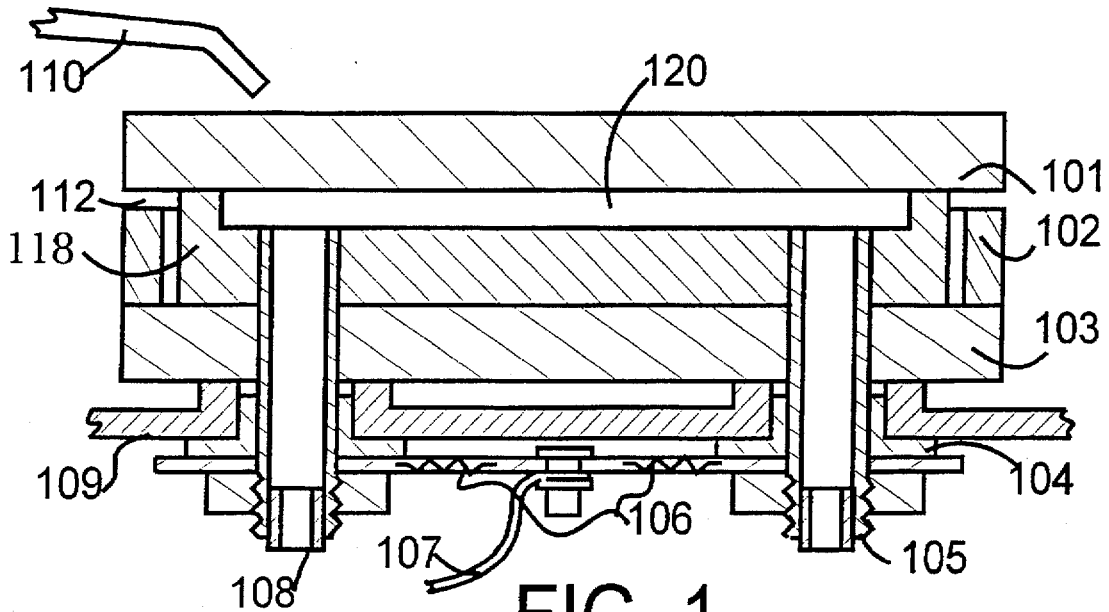
FIG. 1 is a sectional view of an arc source cathode with an insulating ring in close proximity to the cantilevered back side of a target with direct water cooling and no backing plate.

Referring now to the drawings, in particular, the invention embodied therein comprises a design that simplifies the prior art and stabilizes the arc between the target 101, as shown in FIG. 1 and the anode. In accordance with the invention the target 101 is manufactured from the coating material and is evaporated by the arc. The target 101 is placed on the cathode body 118 which serves to hold the target 101, providing cooling and electrical connections to the target 101. The cathode body 118 can be manufactured from aluminum, copper, stainless, or other materials known in the art. The target 101, as illustrated in FIG. 1, has sufficient strength to support itself, thereby not requiring the backing plate 211 illustrated in FIG. 2. An insulation ring 102 encompasses the cathode body 118, preventing the arc from reaching the cathode body 118 as well as insulating the cathode body 118 from the chamber walls 109. The insulation ring 102 is in close proximity, but not adjacent to, the cantilevered lower side of the target 101. The insulation ring 102 is separated from the target 101 by a gap 112. The gap 112 prevents the arc from reaching the cathode body 118 by eliminating any path for the arc to travel along. In some prior art devices, due to contact with the edge of the cathode, the insulator ring had to be Boron Nitride or some other very high temperature insulator material. These very high cost insulator materials are required to prevent damage to the insulator as a result of the necessary high power. The arc is not, however, always prevented from "jumping" the insulator and damage to the cathode body is not uncommon. This not only destroys the cathode but stops the production process, both of which are costly. The gap 112 between the target 101 and the insulator ring 102 provides further advantage by enabling the use of much lower cost materials. This is achieved by eliminating the contact between the target 101 and ring 102. In the disclosed system porcelain or glass can be used to manufacture the insulator ring 102, resulting in a much lower overall production cost. Further cost savings are provided through the ability to access the entire surface of the target 101. In prior art systems, a magnet is used to steer the arc in an attempt to prevent the arc from leaving the target. This does not, however, utilize the entire surface of the target. The disclosed invention allows for complete utilization of the entire surface of the target.

The underside of the cathode body 118 is electrically insulated through use of a plastic back 103. The plastic back 103 extends beyond the cathode body 118, allowing for sufficient clearance in which to mount the insulation ring 102. The plastic back 103 further provides insulation between the cathode assembly and the chamber wall 109. The plastic insulators 104 provide insulation the between the water and power feed throughs 105 and the coating chamber wall 109. Electrical power is supplied to the cathode body 118 trough the power feed 105. The power feed throughs 105 are connected to the electrical source (not shown) by the electric line 107 and resistors 106. The electric line 107 is placed between the two resistors 106 to allow for the current to automatically shift from one side to the other. The arc wants to travel to the electric line 107, however it is prevented from doing so by the gap 112 and the path of least resistance created by the resistors 106. The resistors 106, in series with the power feed throughs 105, have a low value of resistance (0.1 to 2 ohms) and a high temperature coefficient of resistance. As the resistors 106 alternatingly heat, they cause the arc to continuously move from end to end on the target 101, seeking the path of least resistance. The continual end-to-end movement provides for uniform erosion of the target 101. It is preferable that the resistors 106 be capable of conducting target currents of up to 300 amps. As one resistor 106 heats and increases resistance, the arc moves to the path of lower resistance, without using an active circuit.

The water feed throughs 108 are used to cool the under side of the target 101 and the cathode body 118. The water enters the first feed trough 108, runs along the canal 120 and exits through the second feed trough 108. A tungsten striker 110, which is connected through a current limiting resistor to the anode, is used to initiate the arc.

Figure 2:
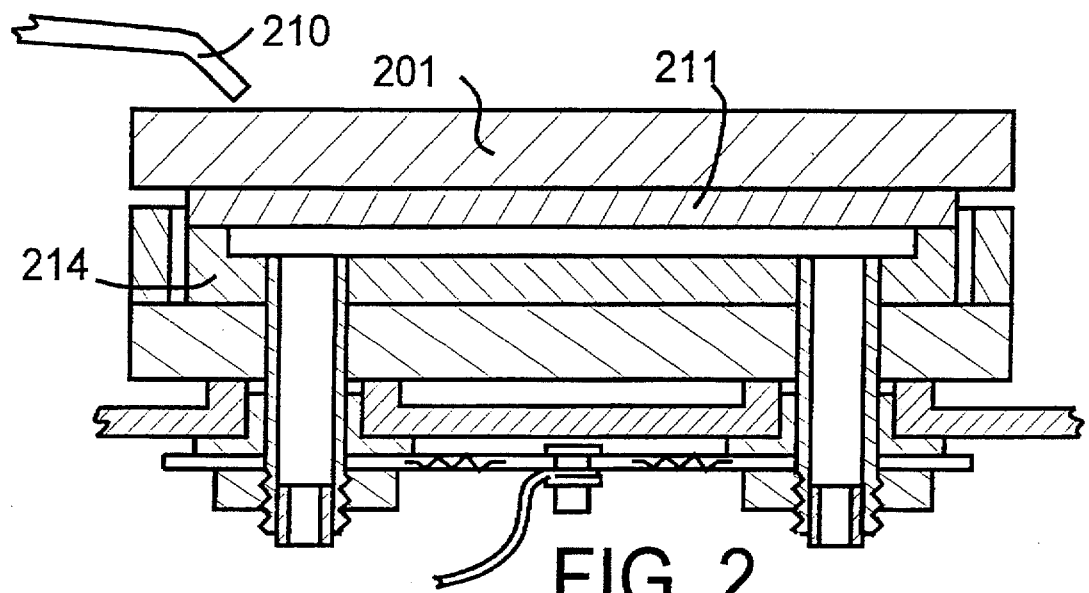
FIG. 2 is an alternate embodiment with the addition of a backing plate bonded to the target.

In FIG. 2, a copper backing plate 211 is added to facilitate bonding of lower strength target materials. The copper backing plate 211 is positioned between the cathode 201 and the support 214. The backing plate 211 is generally manufactured from copper to provide good heat conductivity to the adjacent water channel, although any material providing optimum conductivity can be used.

Figure 3:
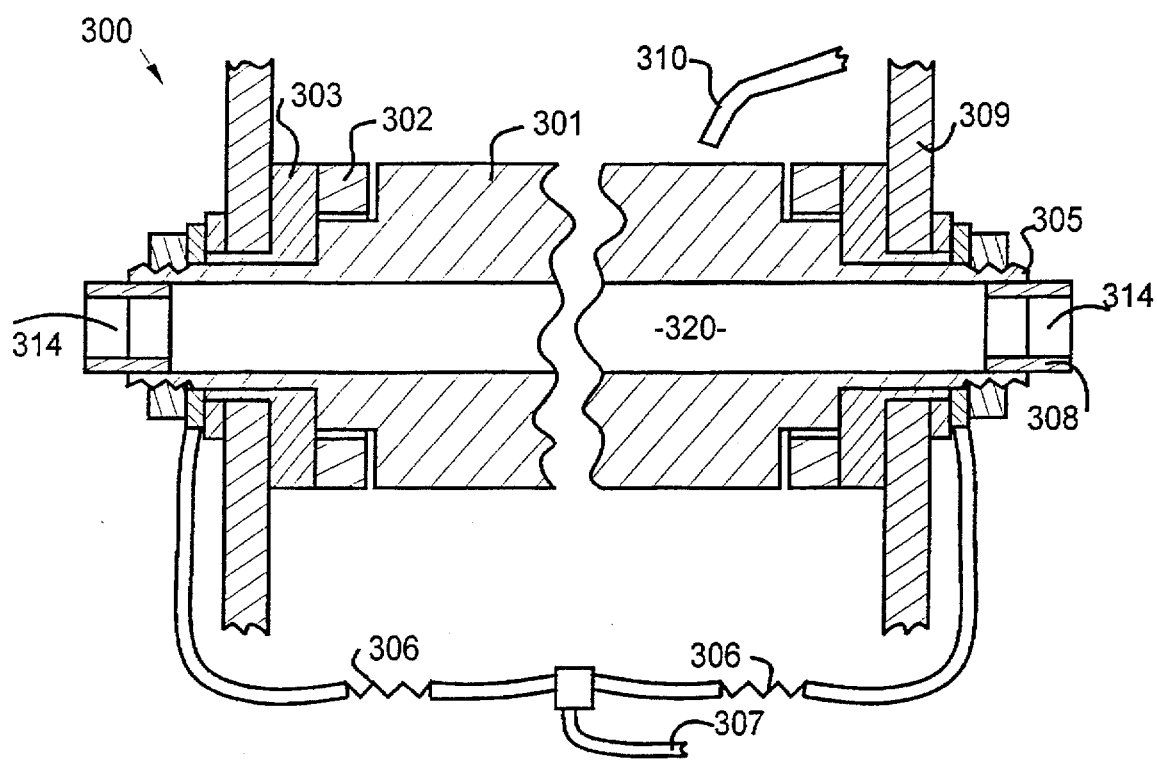
FIG. 3 is a sectional view of a cylindrical arc source cathode with an insulating ring in close proximity to each end.

In FIG. 3 the design disclosed herein is altered to be used with a cylindrical configured chamber. The cylindrical cathode arc source 300 has the same basic components as described heretofore in FIG. 1. The chamber wall 309 is insulated from the cylindrical target 301 through use of insulator ring 302. The insulator ring 302 is insulated from the walls through a plastic backing 303. The insulator ring 302 is separated from the target 301 by a gap 312 which, as set forth heretofore, maintains the arc on the target. In this embodiment, the target 301 is directly water cooled with a water channel 320 down the center. The water is brought into the channel 320 through inlet and outlet ports 314 and 316, utilizing a cooling circulation system known in the art. The cathode is maintained within the chamber through use of washers and nuts as known in the art.

Figure 5:
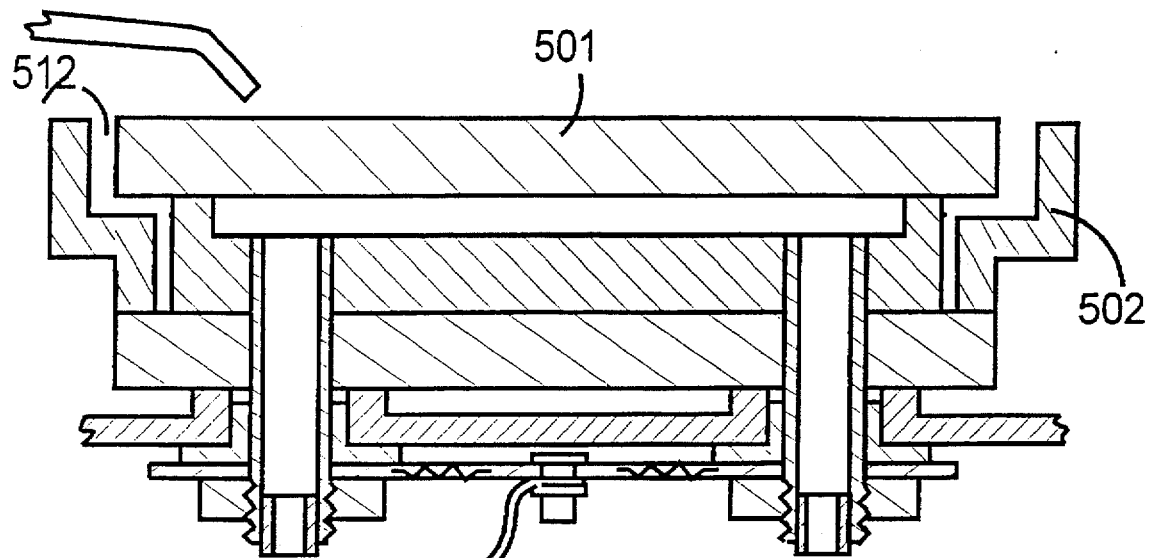
FIG. 5 is a sectional view of an alternate embodiment of the arc source cathode with the insulating ring in close proximity to the back and sides of the target.
Figure 4:
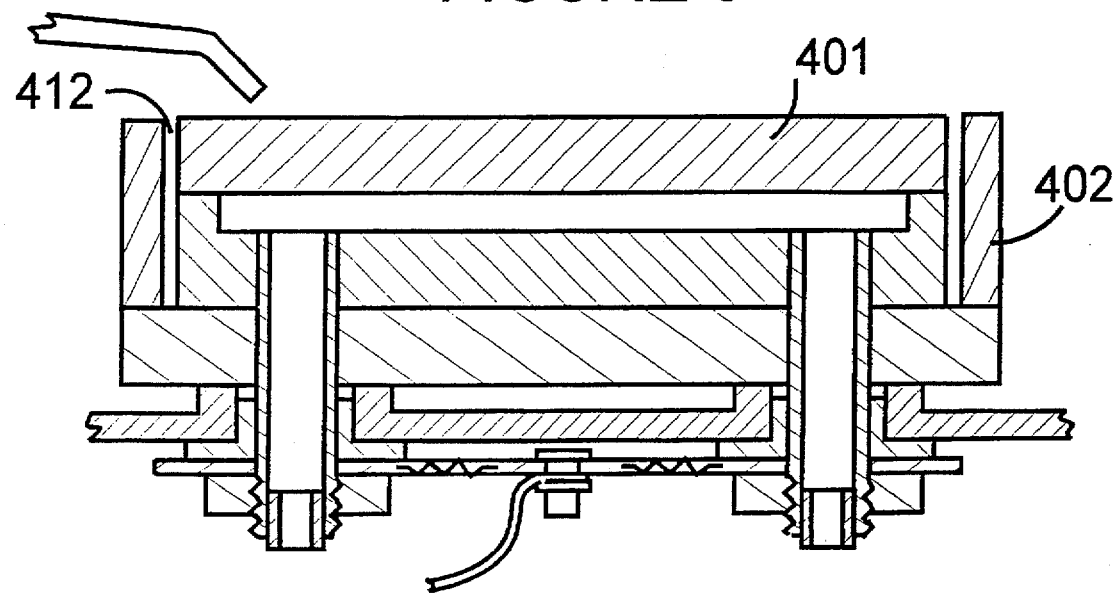
FIG. 4 is a sectional view of an alternate embodiment of the arc source cathode with the insulting ring proximate the sides of the target which, in this embodiment, is not cantilevered.

FIG. 4 illustrates an alternate embodiment to the instant invention wherein the insulator 402 is extended to be parallel with the ends, and flush with the top surface, of the target 401. The insulator 402 and target 401 are separated by the gap 412 to maintain the arc on the target 401. As illustrated in FIG. 4, the target 401 is not cantilevered, due to space considerations. Alternatively, the target 501, as shown in FIG. 5, can be cantilevered and the insulator ring 502 offset to be parallel with the sides of the target 501. The target 501 is separated from the insulator ring 502 by gap 512. The structure of FIG. 5 is thus a combination of the structures of FIGS. 1 and 4.

As with the prior art for cathodic arc cathodes, the current invention may be used either with a water cooled anode along one side of the target in the coating system, or the chamber wall may be water cooled and used as the anode. Also, the striker for initiating the arc is mechanically actuated either from inside or outside the coating chamber. The striker is preferably operated at about 10 amperes, and provided with resistors, not shown.

Applications of the present invention include all applications currently done by cathodic arc evaporation. These include hard, wear resistant coatings as TiN, TiAlN, TiCN, ZrN and others for use on cutting tools, dies, and any parts needing enhanced wear resistance, and Al coatings on plastics, as well as other materials and decorative coatings.

What is claimed is:

1. A cathodic arc cathode within a chamber having:
    a cathodic arc target, said cathodic arc target having an arc evaporation surface;
    a cathode body;
    an insulator member of electronically nonconductive material, said insulator member being disposed around said cathode body and insulating said cathode body from the walls of said chamber;
    said cathode body being positioned within said insulator member and said cathodic arc target being positioned in electrical contact with said cathode body and having a cantilevered region which extends over said insulator member,
    a gap, said gap being approximately 0.015 inches and extending in a first direction between said cathodic arc target and said insulator member and in a second direction between said cathode body and said insulator member, said cathodic arc target evaporation surface being on the side of the cathodic arc target which faces away from said gap;
    electrical means, said electrical means supplying power to said cathode body;
    wherein said gap prevents an arc from jumping from said cathodic arc target to said insulator member, thereby preventing damage to said cathode body.

2. The cathode of claim 1 further comprising an electrically insulated back, said insulated back being proximate, and extending beyond said cathode body, to provide support for said insulator ring, thereby providing insulation between said cathode body and said chamber wall.

3. The cathode of claim 1 further comprising at least two resistors spaced from said cathode body, said resistors being alternatingly heated by said arc current, producing a heated resistor and an unheated resistor, whereby said arc alternates between said heated resistor and said unheated resistor as said arc seeks the path of least resistance.

4. The cathode of claim 3 wherein said at least two resistors are placed to draw said arc over said cathodic arc target's surface, thereby providing uniform erosion of said cathodic arc target's surface area.

5. The cathode of claim 3 wherein said at least two resistors have a value of resistance of less than 2 ohms.

6. The cathode of claim 3 wherein said at least two resistors conduct target currents of about 300 amps.

7. The cathode of claim 1 further comprising a cooling channel, said cooling channel having a first feed and a second feed, coolant entering said cooling channel through said first feed and exiting said cooling channel through said second feed.

8. The cathode of claim 7 wherein said cooling channel is proximate the center of said cathode body.

9. The cathode of claim 1 further comprising a backing plate, said backing plate being conductive and adjacent said cathodic arc target, thereby providing support to said cathodic arc target.

10. The cathode of claim 1 wherein said cathode body is circular.

11. The cathode of claim 7 where said cooling channel is proximate said cathodic arc target.

12. The cathode of claim 1 wherein said insulator member is porcelain.

13. The cathode of claim 1 wherein said insulator member is glass.

14. The cathode of claim 1 wherein said gap is in the range from about 0.015 to about 0.150 inches.

15. The cathode of claim 11, where said insulator member has a first region and a second region, said cathode being positioned within said insulator member first region and said cathodic arc target being positioned within said insulator member second region, said cathodic arc target being cantilevered over said insulator member first region and said cantilevered region having an upper surface, a side surface and a lower surface, said gap extending in a third direction between said cathodic arc target body cantilever region side surface and said insulator member, in said first direction between said cathodic arc target cantilevered region lower region and in said second direction between said insulator member and said cathode, said second direction being different from said first direction and said third direction.

16. The cathode of claim 15, where said second direction forms a substantially right angle with said first direction.

17. The cathode of claim 16, where said second direction forms a substantially right angle with said third direction.

18. The cathode of claim 15, where said second direction forms a substantially right angle with said third direction.

19. The cathode of claim 1 further comprising a cooling channel, said cooling channel having a first feed and a second feed, coolant entering said cooling channel through said first feed and exiting said cooling channel through said second feed, said cooling channel being in direct thermal contact with said cathode and being proximate the center of said cathode body.

20. The method of vapor deposition using a cathodic arc cathode having a target, said target having a surface area; a cathode body; an insulator ring, said insulator ring being disposed around said cathode body and insulating said cathode body from the walls of said chamber; a gap, said gap being about 0.015 to 0.150 inches and separating said target and said insulator ring; electrical means, said electrical means supplying power to said cathode body; an electrically insulated back, said insulated back being proximate, and extending beyond, the underside of said cathode body, to provide support for said insulator and insulation between said cathode body and said chamber wall; at least two resistors spaced from said cathode body, said resistors being alternatingly heated by said arc, producing a heated resistor and an unheated resistor, thereby alternating said arc between said heated resistor and said unheated resistor as said arc seeks the path of least resistance; a cooling channel, said cooling channel having a first feed and a second feed, coolant entering said cooling channel through said first feed and exiting said cooling channel through said second feed;

comprising the steps of:
placing the target onto the cathode body;
activating the arc;
vaporizing said target through the movement of said arc from a heated resistor to an unheated resistor as said arc seeks the path of least resistance;
wherein said gap geometry prevents said arc from jumping from said target to said insulator ring, thereby preventing damage to said cathode body.

21. A cathodic arc cathode within a chamber having:

a cathodic arc target, said cathodic arc target having a surface area;

a cathode body;

an insulator member of electronically nonconductive material, said insulator member being disposed around said cathode body and insulating said cathode body from the walls of said chamber;

a gap, said gap being approximately 0.015 inches and separating said cathodic arc target and said insulator member;

electrical means, said electrical means supplying power to said cathode body; and at least two resistors spaced from said cathode body, said resistors being alternatingly heated by said arc current, producing a heated resistor and an unheated resistor, whereby said arc alternates between said heated resistor and said unheated resistor as said arc seeks the path of least resistance and wherein said gap prevents said arc from jumping from said target to said insulator member, thereby preventing damage to said cathode body.

* * * * *